(12) United States Patent
Huang et al.

(10) Patent No.: US 11,056,672 B2
(45) Date of Patent: Jul. 6, 2021

(54) DISPLAY PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Weiyun Huang, Beijing (CN); Wen Tan, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 329 days.

(21) Appl. No.: 16/098,246

(22) PCT Filed: Mar. 12, 2018

(86) PCT No.: PCT/CN2018/078732
§ 371 (c)(1),
(2) Date: Nov. 1, 2018

(87) PCT Pub. No.: WO2019/019656
PCT Pub. Date: Jan. 31, 2019

(65) Prior Publication Data
US 2020/0328373 A1    Oct. 15, 2020

(30) Foreign Application Priority Data

Jul. 27, 2017 (CN) .......................... 201710625395.8

(51) Int. Cl.
*H01L 51/52* (2006.01)
*H01L 27/32* (2006.01)

(52) U.S. Cl.
CPC ........ *H01L 51/5253* (2013.01); *H01L 27/323* (2013.01); *H01L 27/326* (2013.01);
(Continued)

(58) Field of Classification Search
CPC . H01L 51/5253; H01L 27/323; H01L 27/326; H01L 51/529; H01L 27/1218; H01L 27/3227
See application file for complete search history.

(56) References Cited

U.S. PATENT DOCUMENTS

| | | |
|---|---|---|
| 2014/0118826 A1 | 5/2014 | Jiao et al. |
| 2017/0070679 A1 | 3/2017 | Chung et al. |
| 2017/0133444 A1 | 5/2017 | Lee et al. |

FOREIGN PATENT DOCUMENTS

| | | |
|---|---|---|
| CN | 104536179 A | 4/2015 |
| CN | 104885140 A | 9/2015 |

(Continued)

OTHER PUBLICATIONS

The First Chinese Office Action dated Jun. 11, 2019; Appln. No. 201710625395.8.

(Continued)

*Primary Examiner* — Anthony Ho (57) ABSTRACT

Embodiments of the present disclosure disclose a display panel and a display device. The display panel includes: a base substrate and a plurality of pixels located on the base substrate, and an encapsulation layer located on the plurality of pixels. The display panel includes at least one transparent region and a display region outside the at least one transparent region. The plurality of pixels is located in the display region. The transparent region of the display panel is configured to allow non-polarized radiation passing therethrough without substantially polarized. In a direction parallel with the base substrate, a width of the transparent region is substantially greater than a distance between (Continued)

adjacent two of the pixels on the same side of the transparent region. In a plan view, the transparent region is completely located within at least one of the base substrate and the encapsulation layer.

17 Claims, 7 Drawing Sheets

(52) U.S. Cl.
CPC ........ *H01L 27/3234* (2013.01); *H01L 51/529* (2013.01); *H01L 51/5293* (2013.01)

(56) References Cited

FOREIGN PATENT DOCUMENTS

| | | |
|---|---|---|
| CN | 105334994 A | 2/2016 |
| CN | 106445261 A | 2/2017 |
| CN | 106505086 A | 3/2017 |
| CN | 106654037 A | 5/2017 |
| CN | 107359185 A | 11/2017 |
| EP | 2447766 A1 | 5/2012 |

OTHER PUBLICATIONS

International Search Report and Written Opinion dated Jun. 13, 2018; PCT/CN2018/078732.
Extended European Search Report dated Mar. 12, 2021; Appln. No. 18788992.8.

DISPLAY PANEL AND DISPLAY DEVICE

The present application claims priority to the Chinese patent application No. 201710625395.8, filed on Jul. 27, 2017, the entire disclosure of which is incorporated herein by reference as part of the present application.

TECHNICAL FIELD

Embodiments of the present disclosure relate to a display panel and a display device.

BACKGROUND

Currently, for full-screen frameless products, in order to reserve space for the camera and the infrared sensor, it is necessary to perform laser hole-drilling treatment on the organic light-emitting diode (OLED) display panel. The laser hole-drilling treatment is a complicated process, and is a process which would cause damage to a display substrate. Laser hole-drilling can cause undesirable effects such as edge cracks and thermal burns, resulting in reduced product reliability and reduced yield. Moreover, for the edge of the display panel hole-drilled with laser, design on thin film encapsulation is difficult and the encapsulation reliability is poor. Laser hole-drilling on panels with irregular shape has caused problems on OLED backplane circuit and thin film encapsulation (TFE). In summary, the laser hole-drilling in existing art to reserve space for the camera and the infrared sensor in the display product brought disadvantages such as great difficulty on thin film encapsulation, poor encapsulation reliability, and processing damage on the display panel.

SUMMARY

Embodiments of the present disclosure provide a display panel, comprising: a base substrate, a plurality of pixels located on the base substrate, and an encapsulation layer located on the plurality of pixels, the display panel comprising at least one transparent region and a display region outside the at least one transparent region, the plurality of pixels being located in the display region, and the transparent region of the display panel being configured to allow non-polarized radiation passing therethrough without substantially polarized, wherein, in a direction parallel with the base substrate, a width of the transparent region is substantially larger than a distance between adjacent two of the pixels on a same side of the transparent region; wherein, in a plan view, the transparent region is located in at least one of the base substrate and the encapsulation layer.

In an example, the base substrate is a transparent substrate.

In an example, the display region surrounds the at least one transparent region.

In an example, a material of the transparent substrate comprises one or a combination of the following: glass, polyimide, and plastic.

In an example, the encapsulation layer comprises a first inorganic layer, a second inorganic layer, and an organic layer between the first inorganic layer and the second inorganic layer.

In an example, the display panel further comprises a touch screen panel, a polarizer, and a transparent cover which are located on a side of the encapsulation layer opposite to the base substrate.

In an example, the polarizer comprises an opening in the transparent region.

In an example, the touch screen panel comprises a touch electrode made of one or a combination of the following: indium tin oxide, and graphene.

In an example, the display panel further comprises an optical adhesive filled in the opening of the polarizer.

In an example, the at least one transparent region comprises a plurality of transparent regions of different shapes.

In an example, the display panel further comprises a heat dissipation film disposed on a side of the base substrate opposite to the plurality of pixels, wherein the heat dissipation film has an opening region corresponding to the transparent region in shape.

In an example, in a direction parallel with the base substrate, the width of the transparent region is at least 10 times larger than the distance between the adjacent two of the pixels on the same side of the transparent region.

Embodiments of the present disclosure provide a display device, comprising any of the display panel described above, and at least one of a photographing device and a distance sensing device on a side of the display panel, an orthographic projection of the at least one transparent region on a plane completely covers an orthographic projection of the at least one of the photographing device and the distance sensing device on the plane.

In an example, the distance sensing device comprises an infrared sensor.

In an example, the photographing device comprises a camera.

In an example, a portion of at least one selected from the group consisting of the transparent substrate, the encapsulation layer and the touch screen panel is located in the transparent region, and the camera has a color temperature parameter matched with that of a material of at least one selected from the group consisting of the transparent substrate, the encapsulation layer, and the touch screen panel.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure. Based on the described embodiments herein, those skilled in the art can obtain other embodiment(s), without any inventive work.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the present disclosure.

Embodiments of the present disclosure provide a display panel and a display device, in order to reduce process difficulty on thin film encapsulation of the display panel and improve reliability of the thin film encapsulation.

Figure 1:
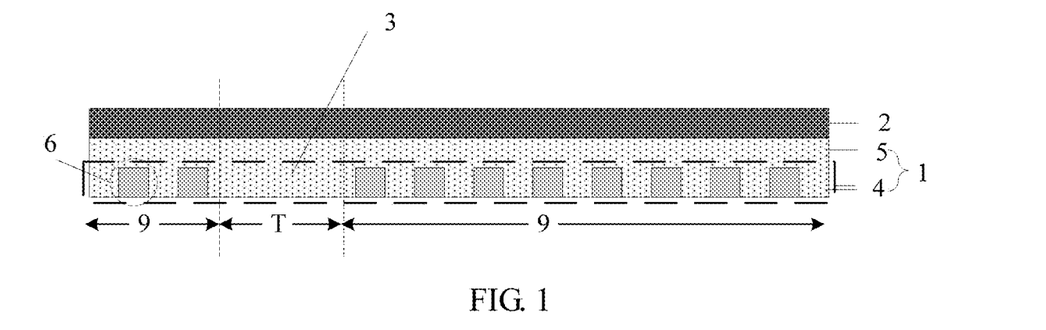
FIG. 1 is a schematic cross-sectional view illustrating a structure of a display panel according to an embodiment of the present disclosure.
Figure 2:
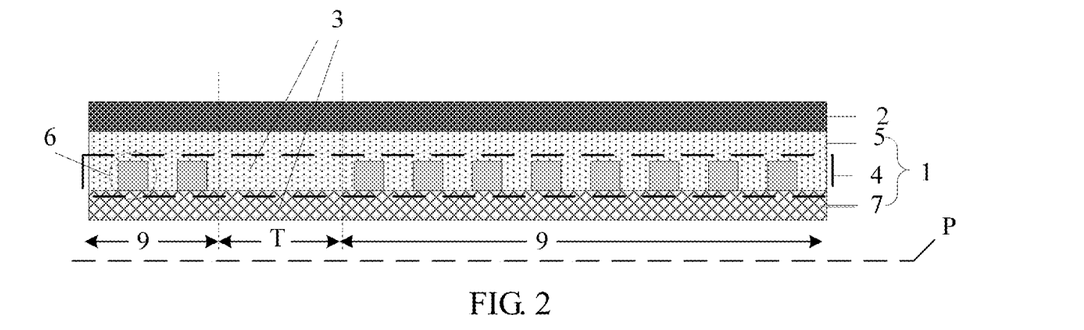
FIG. 2 is a schematic cross-sectional view illustrating a structure of a display panel according to an embodiment of the present disclosure.

As illustrated in FIGS. 1 and 2, a display panel is provided by an embodiment of the present disclosure. The display panel 8 includes: an array substrate 1 and a film layer structure 2 on the array substrate 1. The array substrate 1 and the film layer structure 2 each have a transparent region 3, and an orthographic projection of the transparent region of the array substrate is overlapped with an orthographic projection of the transparent region of the film layer structure in a direction perpendicular to the display panel.

The display panel includes at least one transparent region T and a display region 9 outside the at least one transparent region T. The plurality of pixels 6 are located in the display region D. A non-polarized radiation passes through the transparent region T of the display panel 8 without substantially polarized. The transparent regions 3 of the array substrate 1 and the film layer structure 2 are both located in the transparent region T of the display panel 8.

The array substrate 1 includes a pixel structural layer 4 and an encapsulation layer 5 located on the pixel structural layer. The pixels 6 in the pixel structural layer are located outside the transparent region. An orthographic projection of the transparent region T on a plane P falls into an orthographic projection of the encapsulation layer on the plane P.

The transparent region T has a width at least 10 times larger than a distance between adjacent two pixels on the same side of the transparent region T in a direction parallel with the base substrate. Herein, the distance between two adjacent pixels can refer to a distance between their respective center positions.

In the display panel provided by the embodiment of the present disclosure, the array substrate and the film layer structure each have a transparent region, and an orthographic projection of the transparent region of the array substrate is overlapped with an orthographic projection of the transparent region of the film layer structure in a direction perpendicular to the display panel. That is the display panel provided by the embodiment of the present disclosure has a transparent region, and the pixels in the pixel structural layer are disposed outside the transparent region. That is, opaque material in the pixel circuit of the pixel structural layer is disposed outside the transparent region, so that the encapsulation layer can completely cover the transparent region; therefore, when a display device includes the display panel provided by the embodiment of the present disclosure, the camera and the infrared sensor can be disposed in a region corresponding to the transparent region if they are needed to be placed under the display panel. Laser hole-drill to the display panel is not needed, thus reducing the difficulty on thin film encapsulation during the preparation of the array substrate, improving the reliability of the thin film encapsulation, and avoiding processing damage such as edge cracks, thermal burns and the like caused by laser hole-drilling on the display panel.

Optionally, as illustrated in FIG. 2, in the display panel provided by the embodiment of the present disclosure, the array substrate 1 further includes a transparent substrate 7, and the pixel structural layer 4 is located on the transparent substrate 7.

Figure 3:
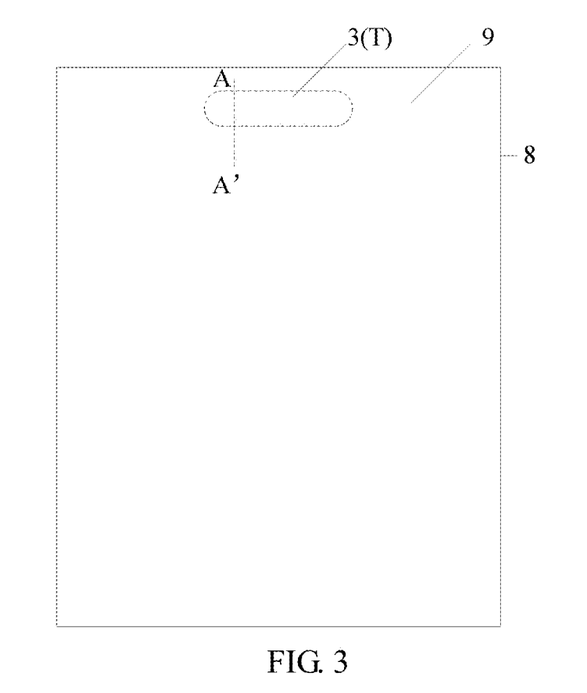
FIG. 3 is a schematic plan view illustrating a structure of a display panel according to an embodiment of the present disclosure.

Optionally, the array substrate and the film layer structure further have a display region, and the display region surrounds the transparent region. That is, as illustrated in FIG. 3, the display panel 8 provided by the embodiment of the present disclosure also has a transparent region T and a display region 9. FIGS. 1 and 2, for example, can be a cross-sectional view taken along line A-A' in FIG. 3.

The display panel provided by the embodiment of the present disclosure can be, for example, an OLED display panel. When a pixel circuit in the pixel structural layer is fabricated onto the transparent substrate, any non-transparent material should avoid presenting in the transparent region, and light-emitting material to be subsequently evaporated is should also avoid presenting in the transparent region, so that the OLED pixels are outside the transparent region and the transparent region is not provided with any non-transparent material.

Optionally, a material of the transparent substrate includes at least one or a combination of the following: glass, polyimide (PI), and plastic. Of course, the transparent substrate can also be selected from other transparent materials, and can also be a flexible material or a non-flexible material.

Figure 4:
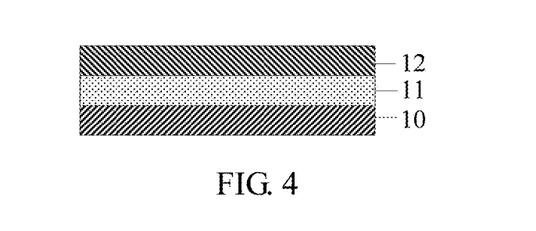
FIG. 4 is a schematic cross-sectional view illustrating a structure of an encapsulation layer in a display panel according to an embodiment of the present disclosure.

Optionally, as illustrated in FIG. 4, in the display panel provided by the embodiment of the present disclosure, the encapsulation layer includes a first inorganic layer 10, an organic layer 11 located on the first inorganic layer 10, and a second inorganic layer 12 located on the organic layer 11. For example, the OLED can be encapsulated by a TFE technology to form an encapsulation layer. The material of the first inorganic layer and the second inorganic layer include at least one or a combination of the following: silicon oxide, and silicon nitride; and the material of the organic layer includes polyacrylate.

Figure 5:
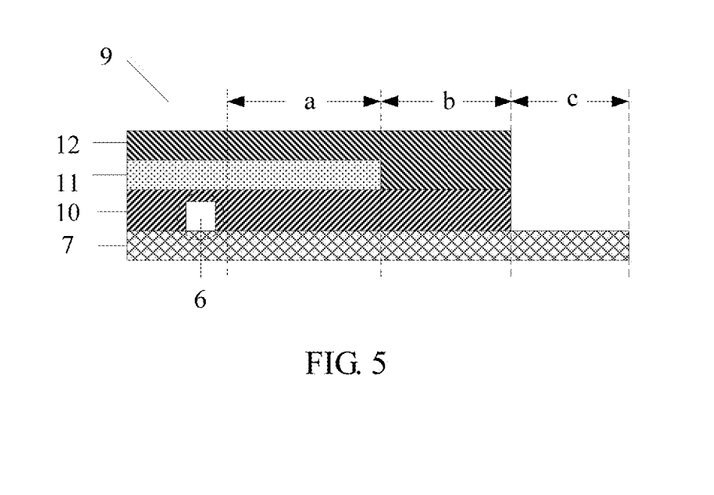
FIG. 5 is a schematic cross-sectional view of edge encapsulation of a display panel according to an embodiment of the present disclosure.

It should be understood that the TFE technology is formed by alternatively stacking inorganic layers and organic layers, thereby effectively blocking moisture and oxygen from entering the OLED device, and avoiding corrosion of the OLED device by moisture and oxygen. In the encapsulation process, as illustrated in FIG. 5, a corresponds to a width of an edge of the organic layer, b corresponds to a width of an edge of the inorganic layer, and c corresponds to a width of an edge of the transparent substrate. For the edge region of the display panel, the TFE process should ensure that a, b, and c in FIG. 5 have relatively large values. For example, a case that a sum of a, b, and c are in a range from 0.7 mm to 1 mm is satisfied, which allows the encapsulation layer to effectively protect the OLED device, that is, to ensure the reliability of the encapsulation layer.

Figure 6:
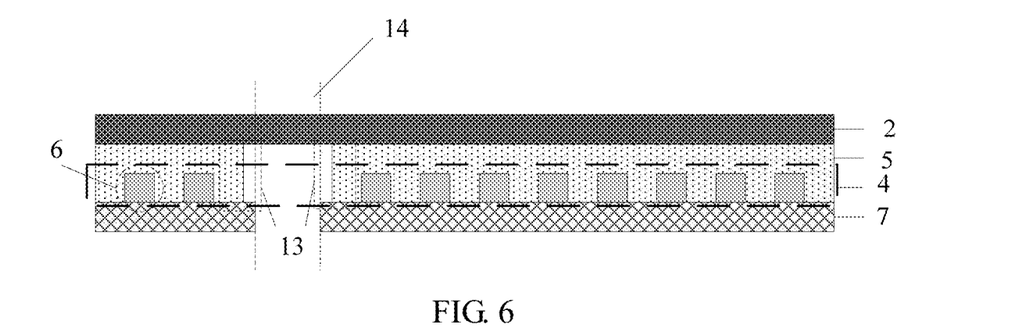
FIG. 6 is a schematic cross-sectional view illustrating a structure of a display panel in which a reserved region is formed by laser hole-drilling.

If a laser-drilling process is performed on the display panel, as illustrated in FIG. 6, that is, in FIG. 6, an edge encapsulation condition needs to be satisfied in an edge region 13; therefore, in the case that the pixel density is the same, a size of a reserved region 14 for laser-drilling is smaller than that of the transparent region 3 of the display panel provided by the embodiment of the present disclosure (as illustrated in FIG. 2). In the case that the reserved region 14 for laser-drilling is the same size as the transparent region 3 as illustrated in FIG. 2, more pixels are needed to be sacrificed for laser hole-drilling. That is, a pixel region of the display panel provided by the embodiment of the present disclosure is larger than a pixel region of the display panel provided by laser-drilling, thereby increasing the pixel density of the display panel.

Figure 7:
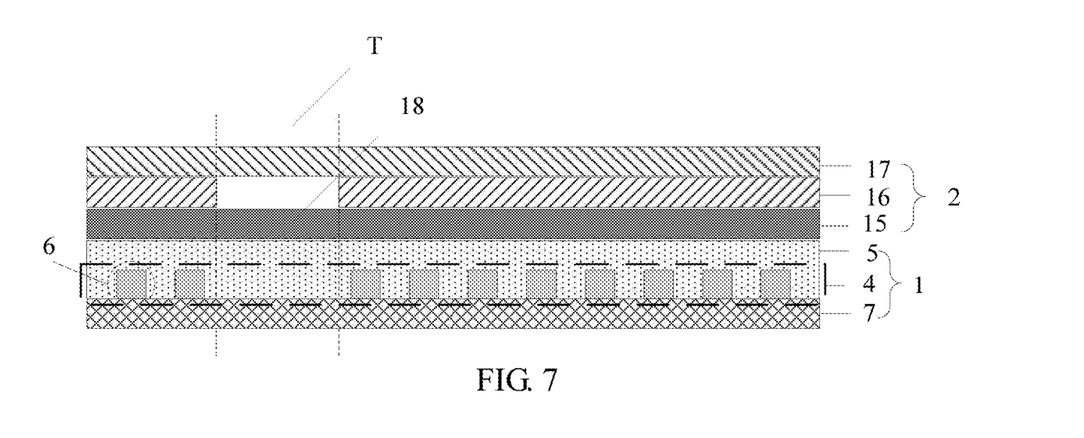
FIG. 7 is a schematic cross-sectional view illustrating a structure of a display panel according to an embodiment of the present disclosure.

Optionally, in the display panel provided by the embodiment of the present disclosure, the film layer structure includes a touch screen panel (TSP), a polarizer (POL), and a transparent cover. As illustrated in FIG. 7, in the display panel provided by the embodiment of the present disclosure, the film layer structure 2 includes a touch screen panel (TSP) 15 located on the array substrate 1, a polarizer (POL) 16 located on the TSP 15, and a transparent cover 17 located on the POL 16.

Figure 8:
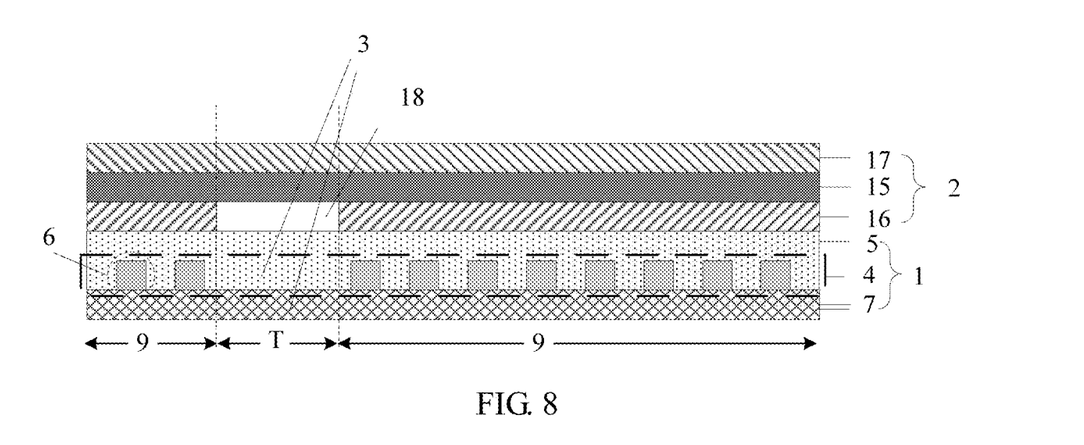
FIG. 8 is a schematic cross-sectional view illustrating a structure of a display panel according to an embodiment of the present disclosure.

Alternatively, the positions of the POL and TSP in FIG. 7 can be interchanged. As illustrated in FIG. 8, a display panel provided by an embodiment of the present disclosure includes a POL 16 located on the array substrate 1, a TSP 15 located on the POL 16, and a transparent cover 17 located on the TSP 15.

Figure 9:
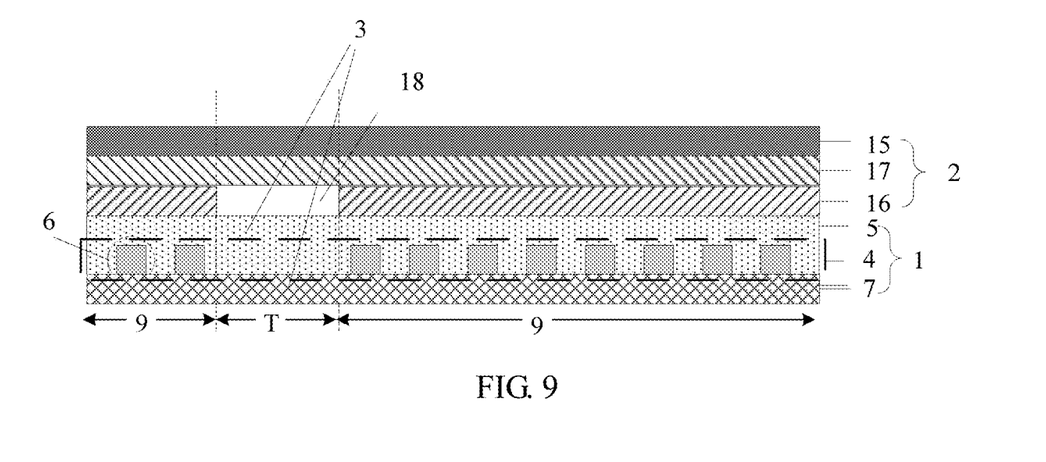
FIG. 9 is a schematic cross-sectional view illustrating a structure of a display panel according to an embodiment of the present disclosure.

Alternatively, the TSP 15 may also be disposed on the transparent cover 17. A display panel structure is, for example, as illustrated in FIG. 9. The film layer structure 2 includes a POL 16 located on the array substrate 1, a transparent cover 17 located on the POL 16, and a TSP 15 located on the transparent cover 17.

The polarizer 16 in FIGS. 7 and 8 has an opening 18, an orthographic projection of the opening 18 is overlapped with an orthographic projection of the transparent region 3 of the film layer structure, in the direction perpendicular to the display panel.

In the display panel provided by the embodiment of the present disclosure, a material of the transparent cover plate can be, for example, glass or other transparent materials.

It should be understood that, in the display panel provided by the embodiment of the present disclosure, the TSP includes a touch electrode, and a material of the touch electrode can be a transparent material or a non-transparent material. In the case that the material of the touch electrode is a non-transparent material, it is required to drill a hole in the step of fabricating the TSP, a hole-drilling region corresponds to the transparent region of the display region. Preferably, in the display panel provided by the embodiment of the present disclosure, the touch screen panel includes a touch electrode, and a material of the touch electrode includes one or a combination of the following materials: indium tin oxide, and graphene. In this way, the touch screen panel is a transparent touch screen panel, hole drilling in the touch screen panel is not needed, and avoid presence of circuit in particular region is also not needed, which further simplifies the process of fabricating the display panel. In the TSPs in FIGS. 7 to 9 provided by the embodiments of the present disclosure, the materials of the touch electrodes are all transparent materials.

Figure 10:
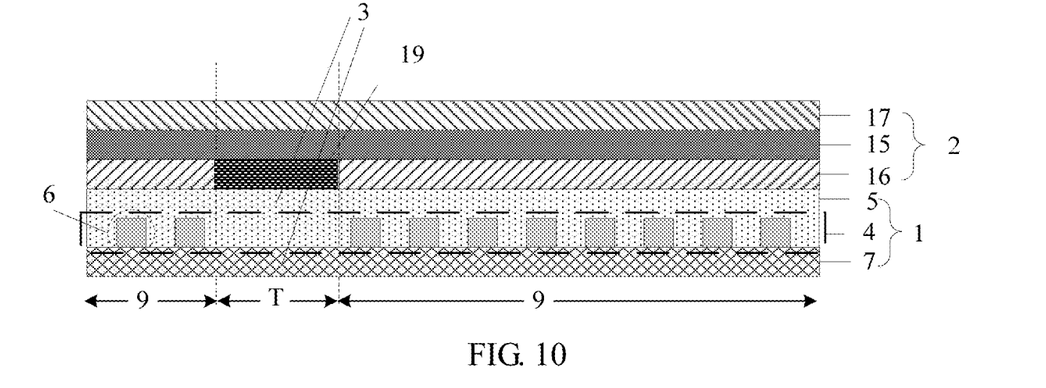
FIG. 10 is a schematic cross-sectional view illustrating a structure of a display panel according to an embodiment of the present disclosure.

Optionally, the film layer structure as illustrated in FIG. 10 further includes an optical adhesive 19. The optical adhesive 19 is in the same layer as the polarizer and fills in the opening of the polarizer. The optical adhesive can be, for example, optically clear adhesive (OCA), optically clear resin (OCR), or the like.

It should be understood that air can be filled in the opening of the POL 16, or an optical adhesive can be provided in the opening of the POL 16. Compared with the opening region filled with air, the opening of the polarizer 16 filled with the optical adhesive makes transition in refractive index of different media in the light transmitting region more uniform, so that in the case that the camera is disposed under the transparent region of the display panel, the shooting effect of the camera is better.

Figure 11:
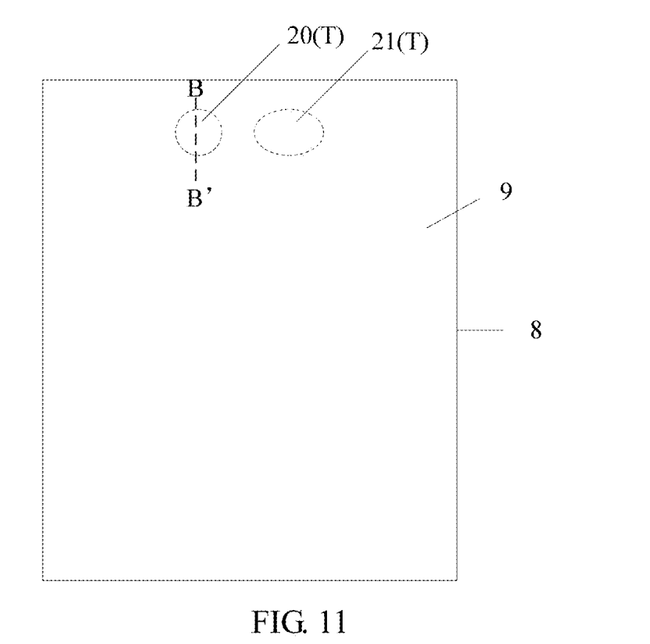
FIG. 11 is a schematic plan view illustrating a structure of a display panel according to an embodiment of the present disclosure.

Optionally, the array substrate and the film layer structure each include a plurality of transparent regions. That is, the display panel also has a plurality of transparent regions. Alternatively, different transparent regions have different shapes. As illustrated in FIG. 11, the display panel 8 has a circular transparent region 20 and an elliptical transparent region 21. The circular transparent region 20 may have a diameter of 5 mm, the elliptical transparent region 21 may have a minor axis of 5 mm, and the elliptical transparent region 21 may have a major axis of 7 to 8 mm.

Figure 12:
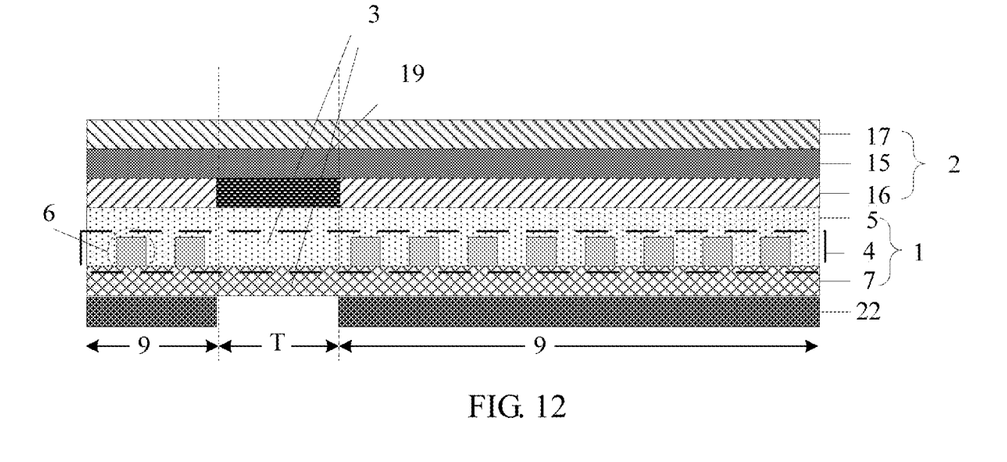
FIG. 12 is a schematic cross-sectional view illustrating a structure of a display panel according to an embodiment of the present disclosure.

Optionally, as illustrated in FIG. 12, the display panel provided by the embodiment of the present disclosure further includes: a heat dissipation film 22 disposed under the array substrate 1. The heat dissipation film 22 has an opening region corresponding to the transparent region in shape. The heat dissipation film can be, for example, a copper film or a graphite film.

A display device, according to an embodiment of the present disclosure, includes the display panel provided by the embodiment of the present disclosure, and a photographing device and a distance sensing device which are located under the display panel. An orthographic projection of the transparent region on a plane completely covers orthographic projections of the photographing device and the distance sensing device on the plane.

Optionally, the photographing device includes a camera, and the distance sensing device includes an infrared sensor.

Figure 13:
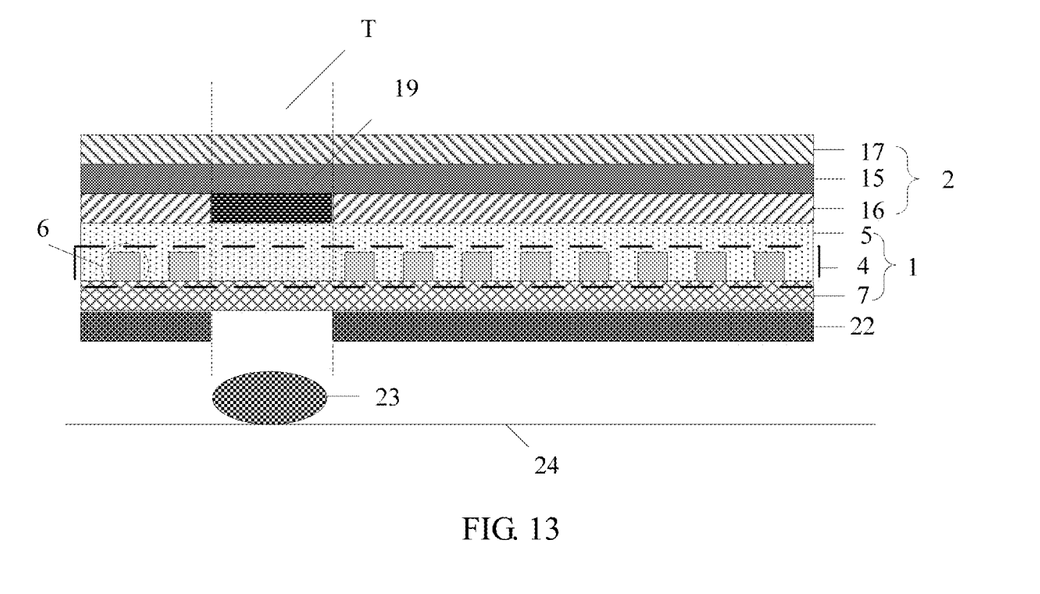
FIG. 13 is a schematic cross-sectional view illustrating a structure of a display device according to an embodiment of the present disclosure.

For example, in the case that the display panel provided by the embodiment of the present disclosure includes a transparent region as illustrated in FIG. 11, an orthographic projection of the circular transparent region 20 on an upper surface of the device body 24 completely covers an orthographic projection of the camera on the device body 24. An orthographic projection of the elliptical transparent region 21 on the upper surface of the device body 24 completely covers an orthographic projection of the infrared sensor on the upper surface of the device body 24. In the case that the display device provided by the embodiment of the present disclosure includes the display panel as illustrated in FIG. 12, a structure of the display device is as illustrated in FIG. 13 (infrared sensor is not illustrated), the camera 23 is disposed on the device body 24, and the display panel is located on the camera 23.

Optionally, in the case that the transparent region is provided with a transparent substrate, an encapsulation layer and a touch screen panel, the camera has a color temperature parameter matched with a color temperature parameter of materials of the transparent substrate, the encapsulation layer and the touch screen panel. In the case that the transparent region of the display panel is provided with a transparent substrate, an encapsulation layer, a TSP and other film layers, a material of the transparent substrate, the encapsulation layer the TSP and the like in the transparent region have an influence on the color temperature of the light passing through the transparent region; therefore, in order to ensure the photographing effect of the camera, the camera has a color temperature parameter matched with a color temperature parameter of the stacked film layer consisting of the transparent substrate, the encapsulation layer, the TSP and other materials. For example, in the case that the camera has a color temperature parameter of 7000 Kelvin (K) and the stacked film layer has a color temperature parameter of 6000 K, the camera is needed to be adjusted to increase the color temperature of the camera, so that the camera can still meet the color temperature requirement of 7000K when the color temperature parameter of the stacked film layer is 6000K.

Optionally, the display device provided by the embodiment of the present disclosure further includes an integrated circuit (IC) and a flexible printed circuit (FPC) which are connected to the display panel.

In summary, in the display panel and the display device provided by the embodiments of the present disclosure, the array substrate and the film layer structure each have a transparent region, and an orthographic projection of the transparent region of the array substrate is overlapped with an orthographic projection of the transparent region of the film layer structure in a direction perpendicular to the display panel. That is, the display panel provided by the embodiments of the present disclosure has a transparent region; because pixels in the pixel structural layer are disposed outside the transparent region, that is, opaque material in the pixel circuit of the pixel structural layer is not provided in the transparent region, so that the encapsulation layer can completely cover the transparent region; therefore, in the case that the display device includes the display panel provided by the embodiment of the present disclosure, the camera and the infrared sensor can be provided in a region corresponding to the transparent region if they are needed to be disposed under the display panel. Laser hole-drilling to the display panel is not needed, thus reducing the difficulty of thin film encapsulation during the manufacturing of the array substrate, improving the reliability of the thin film encapsulation, and avoiding processing damage such as edge cracks and thermal burn-out caused by laser hole-drilling on the display panel. In the display panel provided by the embodiment of the present disclosure, the touch screen panel is a transparent touch screen panel, and there is no need to drill a hole in the touch screen panel, so no circuit avoidance is needed, which further simplifies the process of manufacturing the display panel. In the display panel provided by the embodiment of the present disclosure, the optical adhesive is filled in the opening of the polarizer, so that the transition in refractive index of different media in the transparent region can be more uniform; therefore, in the case that the camera is disposed under the transparent region of the display panel, the camera has a better shooting effect.

It is apparent that those skilled in the art can make various modifications and variations to the embodiments of the present disclosure without departing from the spirit and scope of the embodiments of the present disclosure. Thus, the present disclosure is intended to cover such modifications and variations as the modifications and variations of the embodiments of the present disclosure are within the scope of the appended claims.

What is claimed is:

1. A display panel, comprising: a base substrate, a plurality or pixels located on the base substrate, an encapsulation layer located on the plurality of pixels, a touch screen panel, a polarizer, and a transparent cover which are located on a side of the encapsulation layer opposite to the base substrate, the display panel comprising at least one transparent region and a display region outside the at least one transparent region, the plurality of pixels being located in the display region, wherein, in a direction parallel with the base substrate, a width of the transparent region is larger than a distance between adjacent two of the pixels on a same side of the transparent region;

wherein, in a plan view, the transparent region is located within at least one selected from the group consisting of the base substrate and the encapsulation layer.

2. The display panel according to claim 1, wherein the base substrate is a transparent substrate.

3. The display panel according to claim 1, wherein the display region surrounds the at least one transparent region.

4. The display panel according to claim 3, wherein a material of the transparent substrate comprises one or a combination of the following: glass, polyimide, and plastic.

5. The display panel according to claim 2, wherein the encapsulation layer comprises a first inorganic layer, a second inorganic layer, and an organic layer between the first inorganic layer and the second inorganic layer.

6. The display panel according to claim 1, wherein the polarizer defines an opening in the transparent region.

7. The display panel according to claim 1, wherein the touch screen panel comprises a touch electrode made of one or a combination of the following: indium tin oxide, and graphene.

8. The display panel according to claim 6, further comprising an optical adhesive filled in the opening of the polarizer.

9. The display panel according to claim 1, wherein the at least one transparent region comprises a plurality of transparent regions of different shapes.

10. The display panel according to claim 1, further comprising a heat dissipation film disposed on a side of the base substrate opposite to the plurality of pixels, wherein the heat dissipation film has an opening region corresponding to the transparent region in shape.

11. The display panel according to claim 1, wherein, in a direction parallel with the base substrate, the width of the transparent region is at least 10 times larger than the distance between the adjacent two of the pixels on the same side of the transparent region.

12. A display device, comprising the display panel according to claim 1, and at least one selected from the group consisting of a photographing device and a distance sensing device on a side of the display panel, an orthographic projection of the at least one transparent region on a plane completely covers an orthographic projection of the at least one elected from the group consisting of the photographing device and the distance sensing device on the plane.

13. A display device according to claim 12, wherein the distance sensing device comprises an infrared sensor.

14. A display device according to claim 12, wherein the photographing device comprises a camera.

15. The display device according to claim 14, wherein a portion of at least one selected from the group consisting of the transparent substrate, the encapsulation layer and the touch screen panel is located in the transparent region, and the camera has a color temperature parameter matched with that of a material of the at least one selected from the group consisting of the transparent substrate, the encapsulation layer, and the touch screen panel.

16. A display panel, comprising: a base substrate, a plurality of pixels located on the base substrate, an encapsulation layer located on the plurality of pixels, a touch screen panel, a polarizer, and a transparent cover which are located on a side of the encapsulation layer opposite to the base substrate, the display panel comprising at least one transparent region and a display region outside the at least one transparent region, the plurality of pixels being located in the display region, wherein, in a direction parallel with the base substrate, a width of the transparent region is larger than a distance between adjacent two of the pixels on a same side of the transparent region;

wherein, an orthographic projection of the transparent region on a plane in a direction perpendicular to the base substrate falls into an orthographic projection of the encapsulation layer on the plane in the direction perpendicular to the base substrate, the plane is paralleled with the base substrate.

17. A display panel, comprising: a base substrate, a plurality of pixels located on the base substrate, and an encapsulation layer located on the plurality of pixels, the display panel comprising at least one transparent region and a display region outside the at least one transparent region, the plurality of pixels being located in the display region, wherein, in a direction parallel with the base substrate, a width of the transparent region is at least 10 times larger than a distance between adjacent two of the pixels on a same side of the transparent region;

wherein, an orthographic projection of the transparent region on a plane in a direction perpendicular to the base substrate falls into an orthographic projection of the encapsulation layer on the plane in the direction perpendicular to the base substrate, the Dane is paralleled with the base substrate.

* * * * *

UNITED STATES PATENT AND TRADEMARK OFFICE
CERTIFICATE OF CORRECTION

Page 1 of 1

PATENT NO. : 11,056,672 B2
APPLICATION NO. : 16/098246
DATED : July 6, 2021
INVENTOR(S) : Weiyun Huang et al.

It is certified that error appears in the above-identified patent and that said Letters Patent is hereby corrected as shown below:

In the Claims

Column 10, Lines 19-20, reads:
"... the Dane is paralleled with the base substrate."

Should read:
--... the plane is paralleled with the base substrate.--

Signed and Sealed this
Thirtieth Day of November, 2021

Drew Hirshfeld
*Performing the Functions and Duties of the*
*Under Secretary of Commerce for Intellectual Property and*
*Director of the United States Patent and Trademark Office*